(12) United States Patent
Johnson

(10) Patent No.: US 7,995,420 B2
(45) Date of Patent: Aug. 9, 2011

(54) USER SELECTABLE BANKS FOR DRAM

(75) Inventor: Christopher S. Johnson, Meridian, ID (US)

(73) Assignee: Round rock Research, LLC, Mt. Kisco, NY (US)

( * ) Notice: Subject to any disclaimer, the term of this patent is extended or adjusted under 35 U.S.C. 154(b) by 0 days.

(21) Appl. No.: 12/644,499

(22) Filed: Dec. 22, 2009

(65) Prior Publication Data

US 2010/0097878 A1 Apr. 22, 2010

Related U.S. Application Data

(63) Continuation of application No. 11/786,013, filed on Apr. 10, 2007, now Pat. No. 7,636,271, which is a continuation of application No. 10/781,125, filed on Feb. 18, 2004, now Pat. No. 7,203,122, which is a continuation of application No. 10/073,543, filed on Feb. 11, 2002, now Pat. No. 6,721,227.

(51) Int. Cl.
*G11C 8/00* (2006.01)

(52) U.S. Cl. ......... 365/230.03; 365/230.01; 365/230.06; 365/230.08

(58) Field of Classification Search .............. 365/230.03, 365/230.01, 230.06, 230.08
See application file for complete search history.

(56) References Cited

U.S. PATENT DOCUMENTS

| | | |
|---|---|---|
| 4,757,440 A | 7/1988 | Scheuneman |
| 5,805,520 A | 9/1998 | Anglada et al. |
| 5,812,491 A | 9/1998 | Shinozaki et al. |
| 5,896,404 A | 4/1999 | Kellogg et al. |
| 5,912,860 A | 6/1999 | Schaefer |
| 5,973,988 A | 10/1999 | Nakahira et al. |
| 5,978,297 A | 11/1999 | Ingalls |
| 6,026,465 A | 2/2000 | Mills et al. |
| 6,044,032 A | 3/2000 | Li |
| 6,055,615 A | 4/2000 | Okajima |
| 6,084,818 A | 7/2000 | Ooishi |
| 6,104,668 A | 8/2000 | Lee et al. |
| 6,111,814 A | 8/2000 | Schaefer |
| 6,185,654 B1 | 2/2001 | VanDoren |
| 6,278,648 B1 | 8/2001 | Cowles et al. |
| 6,279,087 B1 | 8/2001 | Melo et al. |
| 6,289,413 B1 | 9/2001 | Rogers et al. |
| 6,304,510 B1 | 10/2001 | Nobunga et al. |
| 6,310,805 B1 * | 10/2001 | Kasa et al. .................. 365/200 |
| 6,327,181 B1 | 12/2001 | Akaogi et al. |
| 6,366,524 B1 | 4/2002 | Abedifard |
| 6,373,752 B1 | 4/2002 | Wright et al. |
| 6,418,066 B1 | 7/2002 | Hidaka |
| 6,466,825 B1 | 10/2002 | Wang et al. |
| 6,496,444 B2 | 12/2002 | Roohparvar |
| 6,549,468 B2 | 4/2003 | Zitlaw et al. |
| 6,601,130 B1 | 7/2003 | Silvkoff et al. |
| 6,721,227 B2 | 4/2004 | Johnson |
| 6,883,044 B1 | 4/2005 | Roohparvar |
| 7,203,122 B2 | 4/2007 | Johnson |
| 2001/0043502 A1 | 11/2001 | Ooishi |
| 2002/0110041 A1 | 8/2002 | Kono |
| 2003/0026130 A1 | 2/2003 | Fasoli |
| 2003/0028704 A1 * | 2/2003 | Mukaida et al. ................. 711/5 |

* cited by examiner

*Primary Examiner* — Thong Q Le
(74) *Attorney, Agent, or Firm* — Lerner, David, Littenberg, Krumholz & Mentlik, LLP

(57) ABSTRACT

A memory device includes a configurable array of memory cells. A number of array banks is configured based upon data stored in a mode register or decoded by logic circuitry. The memory device remains a full capacity memory, regardless of the number of array banks. Memory address decoding circuitry is adjusted to route address signals to or from a bank address decoder based upon the number of array banks selected.

15 Claims, 2 Drawing Sheets

USER SELECTABLE BANKS FOR DRAM

CROSS-REFERENCE TO RELATED APPLICATIONS

This is a continuation application of application Ser. No. 11/786,013, filed Apr. 10, 2007, titled USER SELECTABLE BANKS FOR DRAM (U.S. Pat. No. 7,636,271, issued Dec. 22, 2009), which is a continuation application of application Ser. No. 10/781,125, filed Feb. 18, 2004, titled USER SELECTABLE BANKS FOR DRAM (U.S. Pat. No. 7,203,122, issued Apr. 10, 2007), which is a continuation application of application Ser. No. 10/073,543, titled USER SELECTABLE BANKS FOR DRAM, filed Feb. 11, 2002 (U.S. Pat. No. 6,721,227, issued Apr. 13, 2004), which applications are assigned to the assignee of the present invention and the entire contents of which are incorporated herein by reference.

FIELD

The present invention relates generally to memory devices and in particular the present invention relates to memory bank addressing.

BACKGROUND

Memory devices such as dynamic random access memories (DRAM) include memory cell arrays to store data. The memory array is typically arranged in addressable rows and columns. Often, the array is also arranged in numerous addressable banks. These banks can be physically separated on the memory die and have separate access circuitry. As such, row, column and bank addresses are used to read and write to the memory.

The number of memory array banks provided in a memory device can limit data access speed of the memory. That is, a memory device that has two banks allows the second bank to begin access operations while the first array is accessed. Likewise, additional array banks increase the likelihood that requested data is stored in different banks. Because repeated accesses to the same bank fail to take advantage of the parallel bank access functionality, an increased number of banks is advantageous.

Memory device manufacturers attempt to make new generations of memory devices compatible with prior memory device generations. This compatibility allows one device to be manufactured without making the prior generation obsolete. If the new generation is not compatible, two or more generations are required to support current systems and future systems. Reverse compatible memory devices having a different number of array banks has proven difficult. For example, a new memory design with eight banks has different addressing and physical layout than a four-bank memory device. As such, both four and eight bank memory devices must be manufactured.

Memory manufacturers have provided options that can change the capacity of a memory to reduce power consumption. For example, the memory array and addressing can be modified to reduce storage capacity. By reducing the memory size, portions of the array can be eliminated from refresh operations. While this option reduces power consumption, it does not provide a viable option to configure a memory without reducing the memory capacity.

For the reasons stated above, and for other reasons stated below which will become apparent to those skilled in the art upon reading and understanding the present specification, there is a need in the art for a memory device that can be configured with variable sized array banks.

DETAILED DESCRIPTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a memory device that can operate with a full density while changing addressing schemes. As stated above, an increased number of banks in a memory device can result in more efficient accessing of the memory array. The present invention allows a memory device to be configured to increase or decrease the number of memory array banks without changing the density of the memory. This allows the memory device to be both forward and backward compatible.

Figure 1:
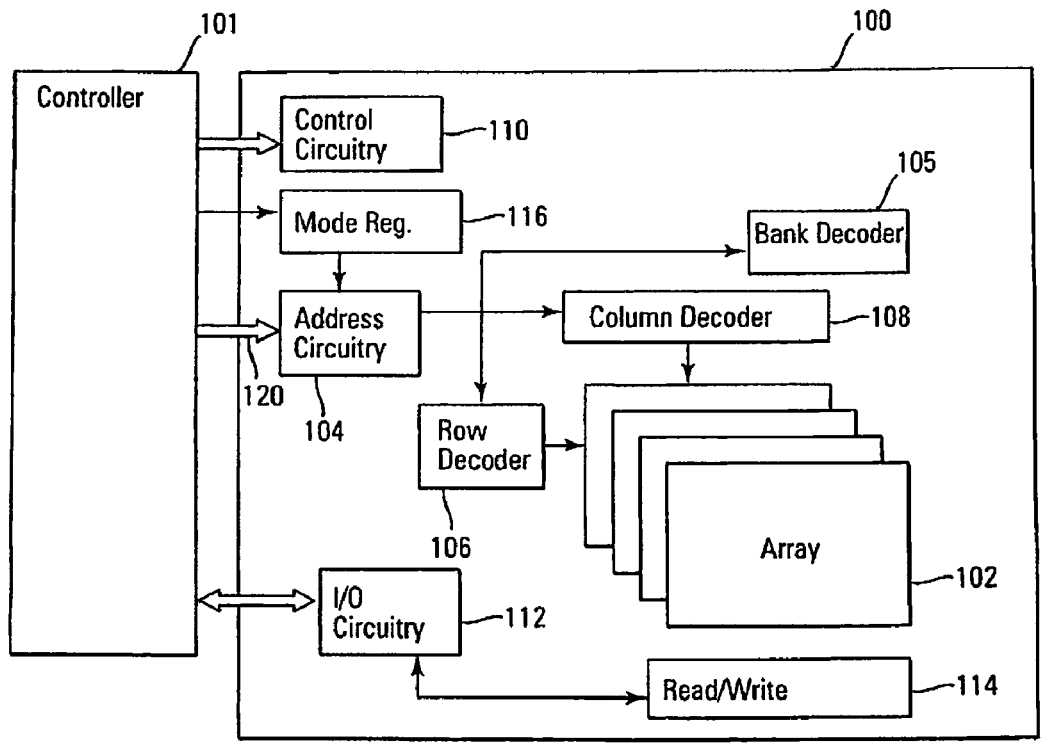
FIG. 1 is a block diagram of a memory device according to one embodiment of the present invention.

Referring to FIG. 1, a block diagram of a memory device 100 according to one embodiment of the present invention is described. The memory device includes an array of memory cells 102 that is arranged in a plurality of physical banks. It will be appreciated that the layout of the array is dependant upon the design of the memory device and the present invention is not limited to any one type of physical layout.

Address circuitry 104 is provided to access the memory cells in combination with bank 105, row 106 and column 108 decoders. A control circuit 110 is provided to perform read and write operations in response to externally provided control signals from controller 101. Bi-directional data communication with the memory array is performed by I/O circuitry 112 and read/write circuitry 114. A mode register 116 is provided to define operating modes for the memory device. The mode register is typically used to define clock latency, burst access type and burst access lengths. The mode register of the present invention is used to set the address circuitry to configure the memory device for different bank addressing. Address input connections 120 include one or more address connections that can be used as either a row or column address, or a bank address.

It will be appreciated by those skilled in the art, with the benefit of the present description, that the memory device has been simplified and that additional circuitry and features may be required. In one embodiment, the memory device is a synchronous DRAM. In yet another embodiment the memory is a DDR SDRAM. The present invention, however, is not limited to a dynamic memory, but can be any memory device having address input connections, such as SDRAM, RDRAM, Flash, DRAM, SRAM, SGRAM and the other semiconductor memories.

Figure 2:
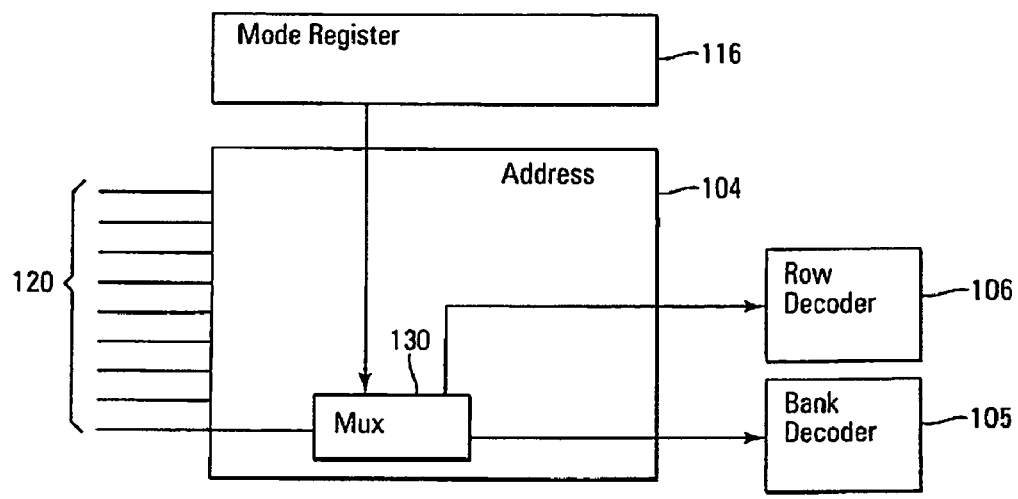
FIG. 2 is a block diagram of addressing circuitry of FIG. 1.

Referring to FIG. 2, a block diagram of the addressing circuitry 104 of FIG. 1 is further described. The mode register 116 is coupled to the address circuit to change the decoding of one or more input address signals. That is, the address signal inputs 120 provided to the memory device include bank, row and column addresses. In a four-bank memory addressing scheme less bank addresses are required than in an eight-bank memory addressing scheme. As such, one or more of the address connections have a dual purpose. When the mode register is programmed to operate as an eight-bank memory, an address input is routed through an address multiplexer circuit 130 to the bank decoding circuit. When the mode register is programmed to operate as a four-bank memory, the address input is routed through the address multiplexer circuit to the row decoding circuit 106. Thus, the memory device can be programmed to operate as either a four-bank memory with X rows per bank, or an eight-bank memory with Y rows per bank without changing the memory capacity. Again, the present invention is not limited to four or eight banks, but can be any combination of banks, rows and columns.

Figure 3:
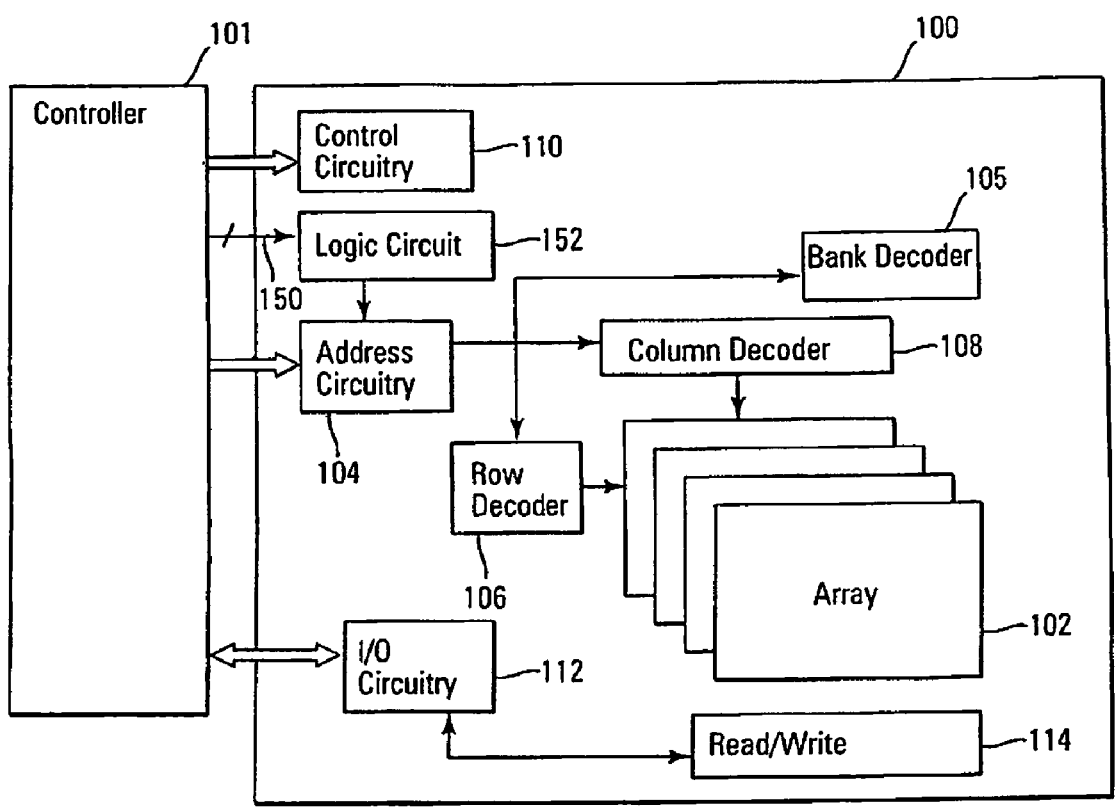
FIG. 3 is a block diagram of a memory device according to another embodiment of the present invention.

In an alternate embodiment, the mode register can be replaced with an external signal input and a decode circuit. Referring to FIG. 3, an external signal is provided on input 150. In one embodiment, this input signal is a one-bit binary configuration signal that is decoded by logic circuit 152. In embodiments where the array can be configured in to multiple different sizes, the input signal may be a multi-bit configuration signal. The logic circuit 152 operates in substantially the same manner as the mode register, as described above. That is, the logic circuitry is used to control the address circuitry to change the number and size of the array blocks.

CONCLUSION

A memory device has been described that includes a configurable array of memory cells. A number of array banks is configured based upon data stored in a mode register. The memory device remains a full capacity memory, regardless of the number of array banks. Memory address decoding circuitry is adjusted to route address signals to or from a bank address decoder based upon the number of array banks selected.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A method of operating a memory, comprising:
   supplying a program state of a mode register coupled to address circuitry of a memory array;
   configuring the memory array into one of a plurality of bank configurations by the address circuitry routing a selected one of a plurality of address signal input connections to either a row address decoder or a bank address decoder in response to the program state of the mode register.

2. The method of claim 1, wherein supplying is performed by an external input signal providing the program state to a decode circuit coupled to the address circuitry.

3. The method of claim 1, further comprising:
   configuring the memory array into either four banks or eight banks depending upon the supplied program state.

4. The method of claim 1, wherein the memory array has X memory cells, and further comprising:
   configuring the memory array into either as Y banks each having X/Y memory cells or as Z banks each having X/Z memory cells.

5. A memory device, comprising:
   an array of memory cells;
   a row address decoder;
   a bank address decoder;
   a configuration circuit comprising a plurality of address signal input connections and a mode register; and
   address circuitry coupled to the configuration circuit to configure the array into one of a plurality of addressable bank configurations by routing a selected one of the plurality of address signal input connections to either the row address decoder or a bank address decoder in response to a program state of the mode register.

6. The memory device of claim 5, wherein the configuration circuit comprises:
   a decode circuit to decode an input signal, the input signal containing data to configure the array of memory cells.

7. The memory device of claim 5, wherein the address circuitry is further configured to define, in response to the program state, the array into one of the plurality of bank configurations.

8. The memory device of claim 7, wherein the address circuitry is further configured to define the array into a configuration of four or eight memory banks.

9. The memory device of claim 7, wherein the array has X memory cells and wherein the address circuitry is further configured to define the array into Y banks each having X/Y memory cells or into Z banks each having X/Z memory cells.

10. The memory device of claim 7, wherein the array has X rows, Y columns, and Z banks, wherein the array comprises X*Y*Z memory cells.

11. A method of configuring a memory device, comprising:
    programming a mode register with a program state indicating a bank configuration, wherein the mode register is coupled to address circuitry of a memory array;
    supplying a configuration signal based on the program state of the mode register;
    configuring an array of memory cells of the memory device into one of a plurality of addressable bank configurations, each of the plurality of addressable bank configurations having a different number of banks; and
    selecting the one of the plurality of addressable bank configurations by routing a selected one of a plurality of address signal input connections to either a row address decoder or a bank address decoder in response to the configuration signal.

12. The method of claim 11, further comprising:
    providing the configuration signal from a decode circuit connectable to an external input signal indicating the bank configuration.

13. The method of claim 11, wherein the array of memory cells is configured into either four banks or eight banks.

14. The method of claim 13, wherein the address circuitry is further configured to route to the bank address decoder for an eight bank configuration and to the row address decoder for a four bank configuration.

15. The method of claim 11, wherein the array of memory cells has X memory cells, and is configured into Y banks each having X/Y memory cells or Z banks each having X/Z memory cells.

* * * * *